(12) United States Patent
Patel

(10) Patent No.: US 6,972,243 B2
(45) Date of Patent: Dec. 6, 2005

(54) FABRICATION OF SEMICONDUCTOR DIES WITH MICRO-PINS AND STRUCTURES PRODUCED THEREWITH

(75) Inventor: Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/674,331

(22) Filed: Sep. 30, 2003

(65) Prior Publication Data

US 2005/0067685 A1 Mar. 31, 2005

(51) Int. Cl.[7] .................. H01L 21/301; H01L 21/46; H01L 21/78
(52) U.S. Cl. .................. 438/461; 438/460; 438/462; 257/692
(58) Field of Search .............. 438/460–462; 257/692

(56) References Cited

U.S. PATENT DOCUMENTS

| | | | | |
|---|---|---|---|---|
| 5,482,887 A | * | 1/1996 | Duinkerken et al. | 438/458 |
| 5,731,222 A | * | 3/1998 | Malloy et al. | 438/113 |
| 5,904,496 A | * | 5/1999 | Richards et al. | 438/106 |
| 5,953,214 A | * | 9/1999 | Dranchak et al. | 361/767 |
| 6,107,179 A | * | 8/2000 | Zomorrodi et al. | 438/612 |
| 6,110,823 A | * | 8/2000 | Eldridge et al. | 438/660 |
| 6,121,119 A | * | 9/2000 | Richards et al. | 438/462 |
| 6,127,274 A | * | 10/2000 | Igel et al. | 438/710 |
| 6,451,705 B1 | * | 9/2002 | Trapp et al. | 438/723 |
| 6,506,664 B1 | * | 1/2003 | Beyne et al. | 438/455 |
| 6,521,970 B1 | * | 2/2003 | Takiar et al. | 257/522 |
| 6,573,157 B1 | * | 6/2003 | Sato | 438/462 |
| 6,664,129 B2 | * | 12/2003 | Siniaguine | 438/107 |

OTHER PUBLICATIONS

S. Kiyono et al, Consideration of Chip Circuit Damages on DCS-FBGA Packages.
Wu, L., Wang, Y.P., Hsiao C. S., Innovative Stack-Die Package—S2BGA.
M. Sunohara et al., Development of Wafer Thinning and Double-Sided Bumping.
Technologies for the Three-dimensional Stacked LSI, all three presented at 52nd Electronic Components and Technology Conference, May 2002, San Diego, CA.
Intel Stacked Chip Scale Packaging Products, available at http://www.intel.com/design/flcomp/prodbref/298051.htm.

* cited by examiner

Primary Examiner—Tom Thomas
Assistant Examiner—Chris C. Chu
(74) Attorney, Agent, or Firm—Robert M. Trepp; David Aker

(57) ABSTRACT

A method for forming a semiconductor die, comprising forming a trench in a surface of the die; filing the trench with a sacrificial material; patterning the die to form a series of channels extending substantially perpendicularly to the trench; depositing a conductive material in the channels; removing at least a portion of the sacrificial material; and removing portions of the die under the trench so as to separate a portion of the die on one side of the trench from a portion on another side of the trench. The sacrificial material may be patterned so that the channels extend so as to be partially in a portion of the die and partially a portion of the sacrificial material. A series of structures are formed having dies with micro-pins.

21 Claims, 17 Drawing Sheets

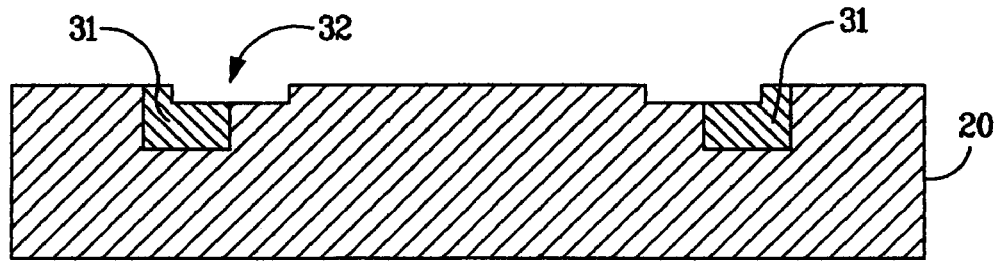
FIG. 2D (i)
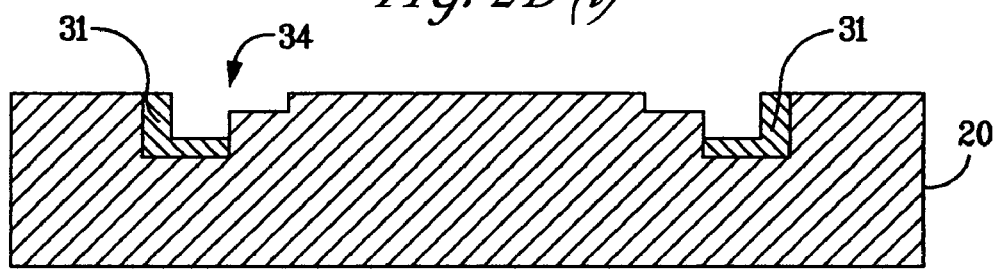
FIG. 2D (ii)
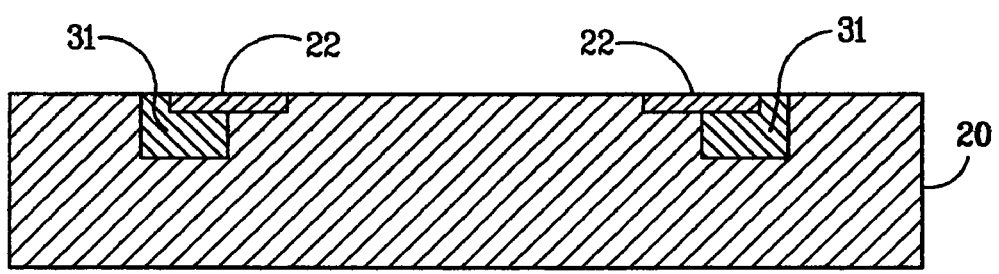
FIG. 2E (i)
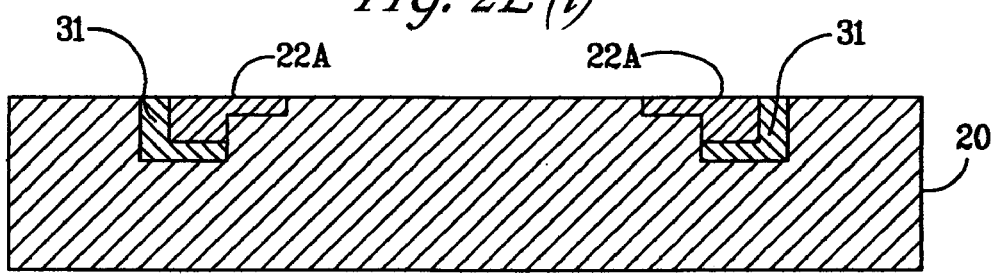
FIG. 2E (ii)

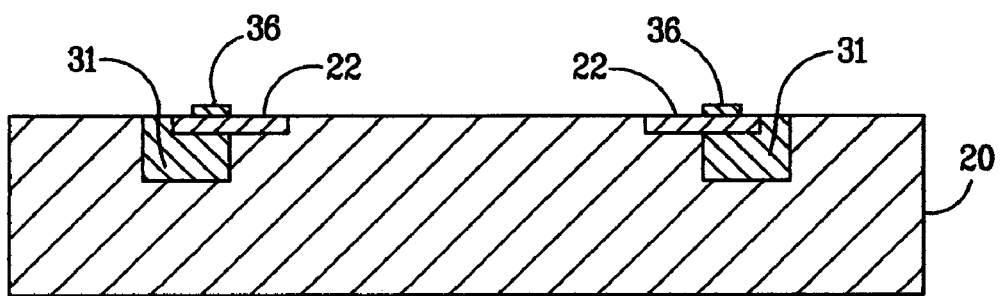
FIG. 2F(i)
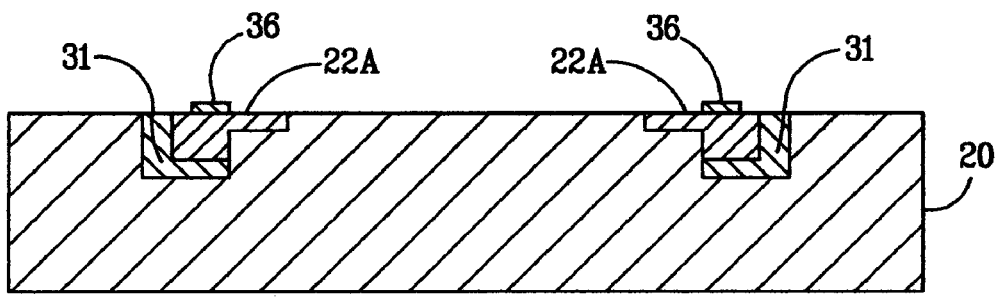
FIG. 2F(ii)
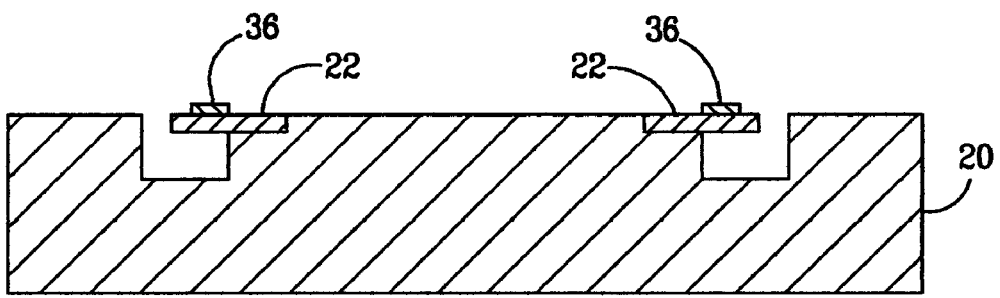
FIG. 2G(i)
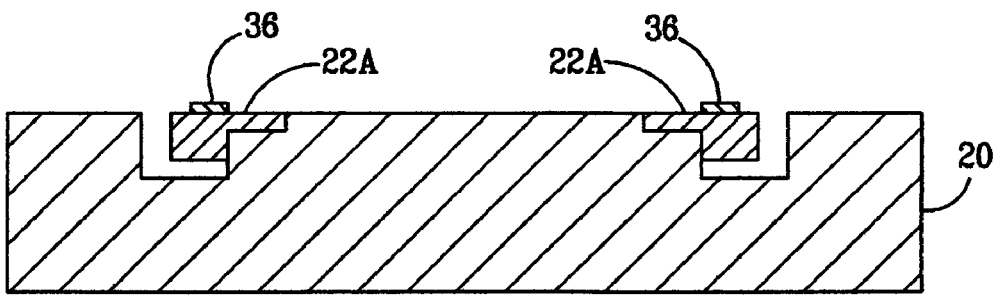
FIG. 2G(ii)

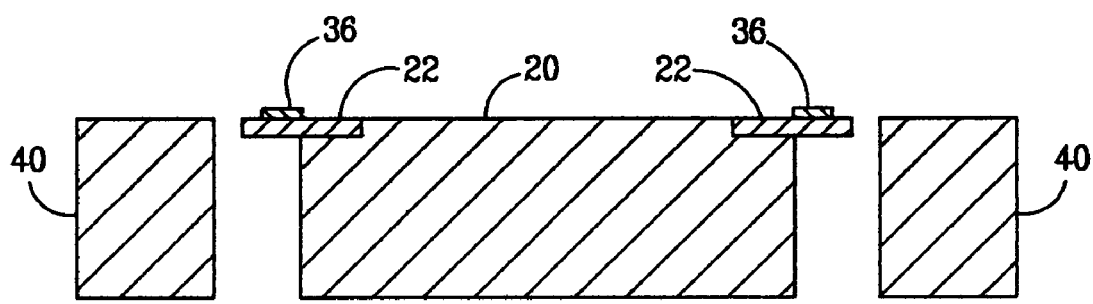
FIG. 2H(i)
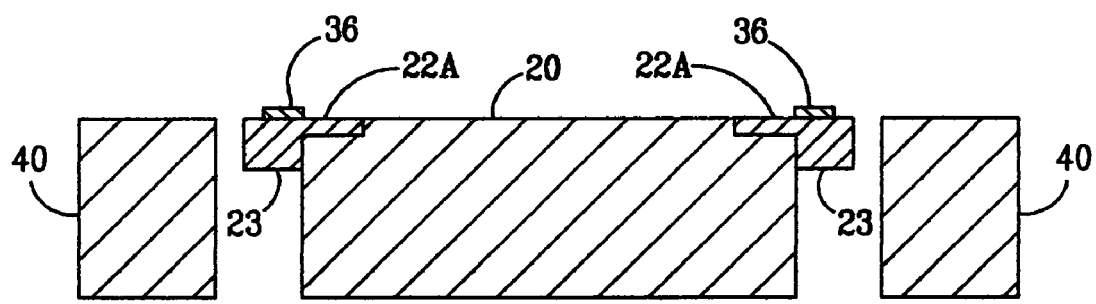
FIG. 2H(ii)
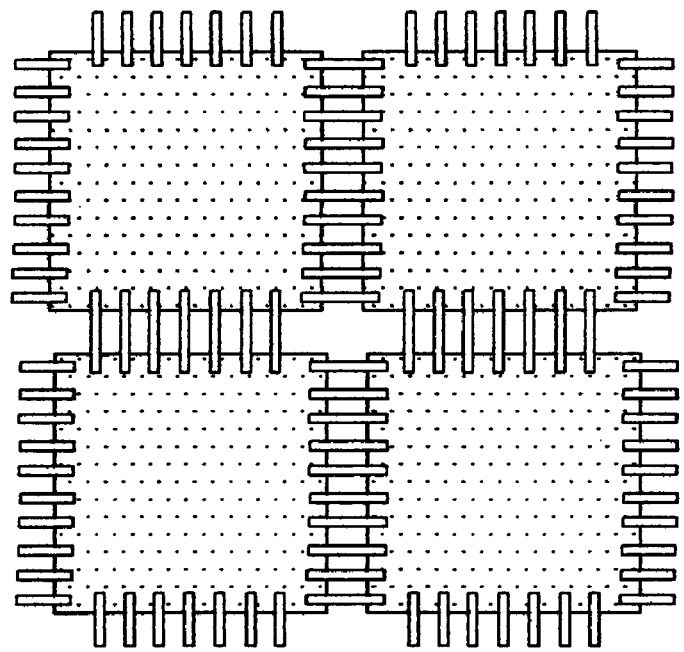
FIG. 12

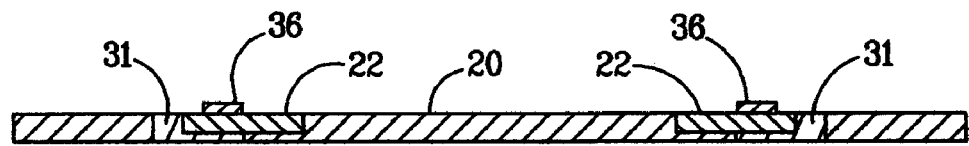
FIG. 2I (i)
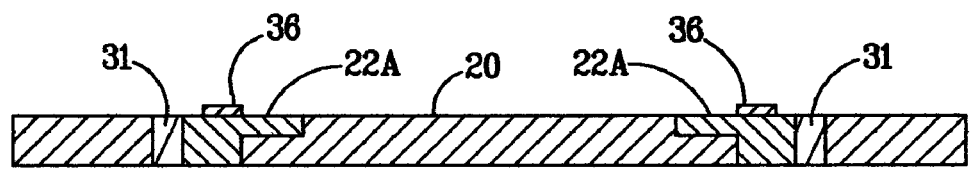
FIG. 2I (ii)
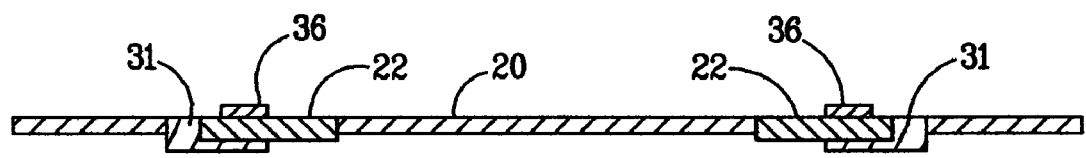
FIG. 2J (i)
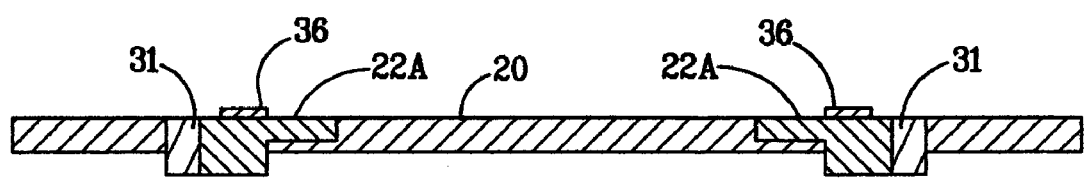
FIG. 2J (ii)

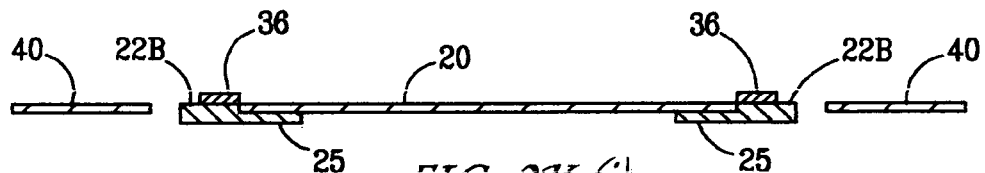
FIG. 2K(i)
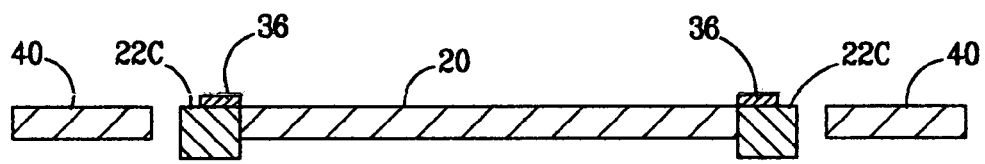
FIG. 2K(ii)
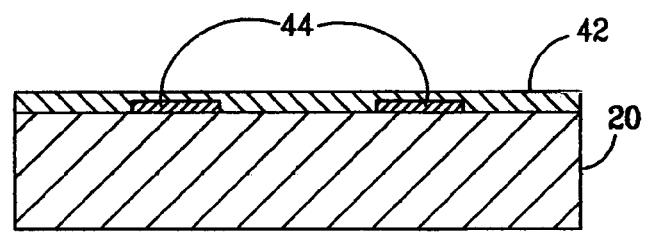
FIG. 2L

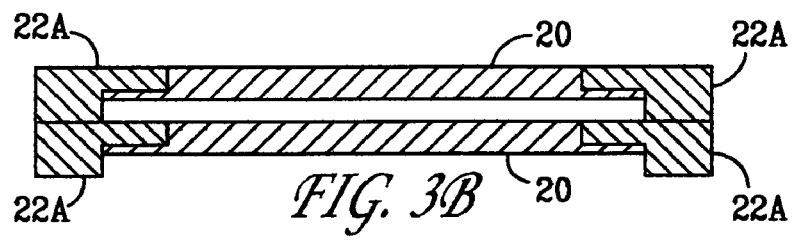
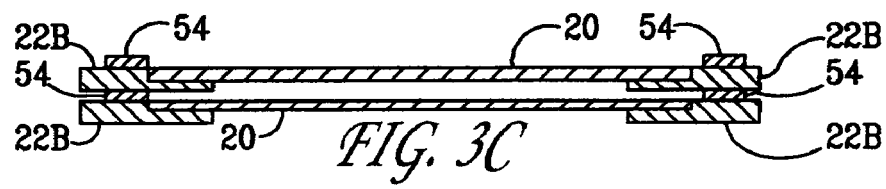
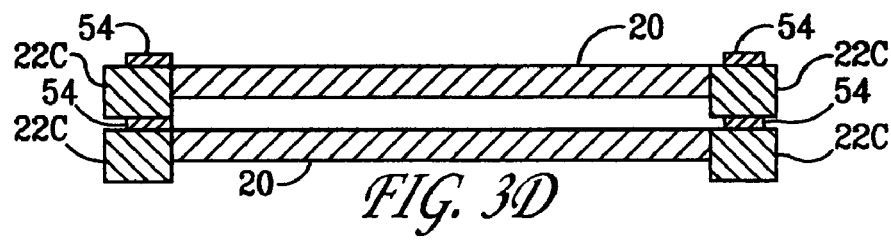
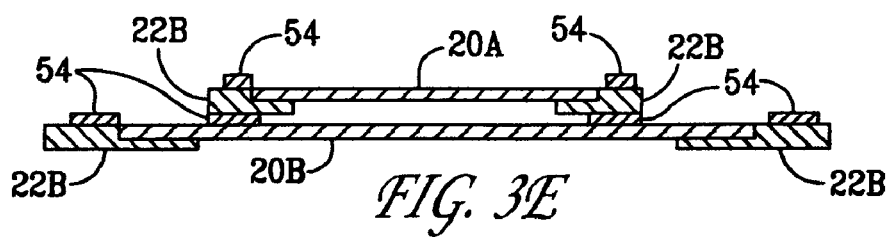
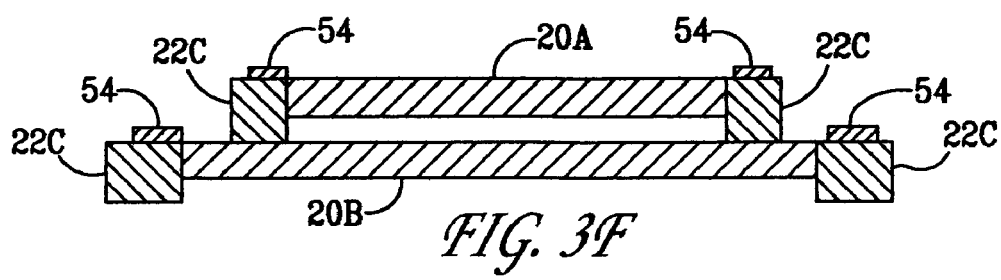

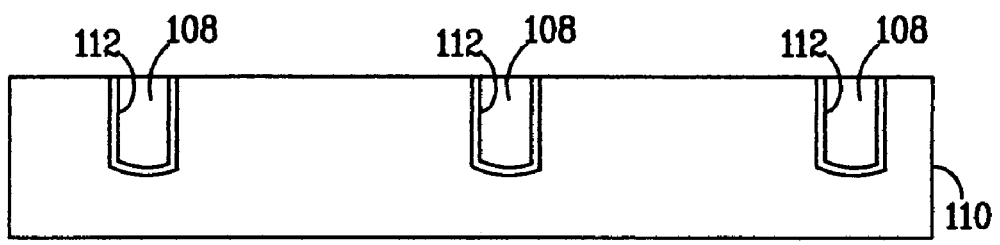
FIG. 10B
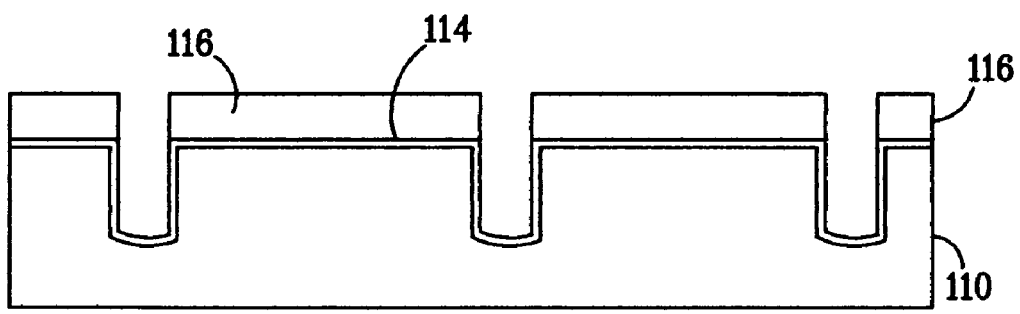
FIG. 10C(i)
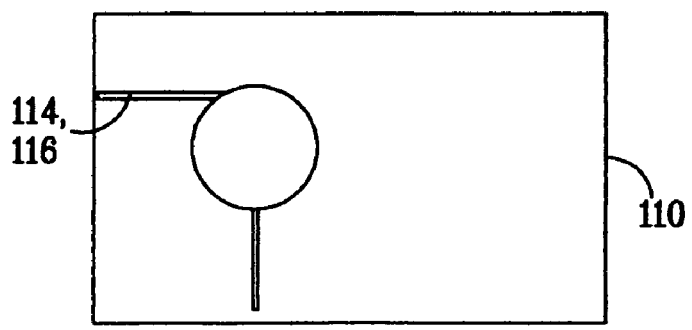
FIG. 10C(ii)

FABRICATION OF SEMICONDUCTOR DIES WITH MICRO-PINS AND STRUCTURES PRODUCED THEREWITH

FIELD OF THE INVENTION

The present invention relates to the packaging and assembly of integrated circuit. More particularly, it relates to a method and apparatus for connecting integrated circuits to one another and to other devices so as to preserve space and so as to create compact electronic packages.

BACKGROUND OF THE INVENTION

Integrated circuits (ICs) or chips are typically connected to packages or directly on to a system board by use of wire bonds or solder bumps that lie on the surface of the ICs. To achieve a compact and higher performance electronic system, it is desirable to stack ICs (in bare or packaged form) on top of each other. Such a stack of ICs may then be packaged using methods that are conventionally used to package an IC and connected to the next level of packaging.

ICs are typically stacked by use of wire bonds or conductive thru-vias that are fabricated within the IC. The art of stacking ICs using wire bonds has been previously published in the literature. Examples are Kiyono, S. S., Yamada, T., Yonehara K., "Consideration of Chip Circuit Damage on DCS—FBGA Packages," 52$^{nd}$ Electronic Components and Technology Conference, May 2002, San Diego, Calif. and Intel Stacked Chip Scale Packaging Products, available at http://www.intel.com/design/flcomp/prodbref/298051.htm. In this approach, a smaller chip is attached on top of a larger chip with the use of an adhesive. The smaller chip is either wire-bonded to a portion of a larger chip or directly wire-bonded to the package substrate. Because a wire bond connection has to be made to all of the chips in the stack, it is required that a chip in the stack be smaller than a chip underneath it. As a result, the size of the chips that can be stacked is limited. To be able to stack chips of the same size, a spacer of specific height and dimension can be inserted between the chips. Wu, L., Wang, Y. P., Hsiao C. S., "Innovative Stack-Die Package—S2BGA," 52$^{nd}$ Electronic Components and Technology Conference, May 2002, San Diego, Calif. Such spacer will separate the chips and will allow enough working distance to enable a wire bond connection. However, the addition of a spacer increases the height of the stack and also adds extra process steps that may complicate and deteriorate the assembly and reliability of the stack. Further, when a spacer is used, it is difficult to make an electrical connection between chips in the stack.

To overcome the limitations of wire bond IC stacks, an alternate approach involving use of conductive thru-vias fabricated within the IC has also been introduced, by Sunohara, M., Fujii, T., Hoshino, M., Yonemura H., Tomisaka, M., Takahashi, K., "Development of Wafer Thinning and Double-Sided Bumping Technologies for the Three-dimensional Stacked LSI," 52$^{nd}$ Electronic Components and Technology Conference, May 2002, San Diego, Calif. In this approach, vias are fabricated into the IC and filled with a conductor. During subsequent process steps, electrical connections are made to these thru-vias, the IC wafer is attached to a carrier wafer, thinned down to expose the thru-via conductor, insulated on the backside and attached to another IC formed using similar process flow. A significant number of expensive process steps are applied to an active, and often thin, IC wafer in this approach. Expensive IC area is used to fabricate conductive thru-vias. In addition, the resultant structure may have poor thermo-mechanical reliability because of a large difference in the Coefficient of Thermal Expansion (CTE) between silicon and the conductive material that is used to fill a thru-via. Assembly processes during IC stacking may introduce mechanical stress that can lead to silicon fracture.

It would be desirable to have a structure and a corresponding process flow that can be easily integrated with semiconductor back end of the line (BEOL) processes and as a result, provides an effective way to either stack ICs on top of each other or assemble them vertically adjacent to each other achieving, in the end, a higher level of system integration by utilising three dimensions.

SUMMARY OF THE INVENTION

It is therefore an aspect of the present invention to provide a semiconductor with pins that facilitate electrical connection.

It is another aspect of the invention to provide a method of manufacturing such semiconductor dies.

It is still another aspect of the invention to provide a plurality of structures that can be constructed using such semiconductor dies.

The invention is directed to methods of fabricating semiconductor die with micro-pins and several embodiments of the structure. The micro-pins fabricated on the semiconductor die can be utilised to stack ICs on top of each other or vertically, or horizontally adjacent to each other. The micro-pins can be used to establish temporary chip attachment points for testing purposes. The micro-pins can also be used to assemble heterogeneous systems; for example, involving attachment of a photo diode on a silicon chip.

Thus, one aspect of the invention is directed to a semiconductor die comprising a planar semiconductor member; and a plurality of conductive pins extending from the semiconductor member in a direction parallel to a plane of the semiconductor member. The pins may extend directly from the semiconductor member. The semiconductor die may have a plurality of sides, with the pins extending from at least one of the sides or all of the sides, generally in a direction perpendicular to a plane of the semiconductor member.

The semiconductor die may be combined with at least one additional semiconductor die, the semiconductor dies being disposed one over another so that respective pins of the semiconductor die are stacked one over to facilitate electrical contact with one another. The respective pins may be diffusion bonded to one another to provide the electrical contact or an electrically conductive material may be disposed between the respective pins so as to provide the electrical contact. The combination may further comprise a substrate on which the combination is mounted. The substrate may be formed of a semiconductor material. A second substrate, on which the first substrate may be mounted, may be formed of an insulating material.

The semiconductor die in accordance with the invention may be combined with at least one other semiconductor die so that successive ones of the semiconductor dies are assembled with at least one wiring substrate between dies, so as to form a solid rectangle or cube. The at least one wiring substrate may provide electrical connections between the dies.

At least one additional semiconductor die may be assembled to the outside of the solid rectangle, the additional semiconductor die having electrical connections to at least one of the dies in the solid rectangle. The wiring substrates may have opening therein to facilitate management of heat.

The invention is also directed to a semiconductor die comprising a planar semiconductor member; with a plurality of first electrically conductive pins formed on a surface of the semiconductor member, the pins having portions extending along a side of the semiconductor member. This semiconductor member may be combined with a second semiconductor member having second electrically conductive pins formed on a surface of the second semiconductor member, the second pins having portions extending along a side of the second semiconductor member, at least a portion of the first pins and the second pins being disposed on the semiconductor members so as to align with one another when the semiconductor members are placed in close proximity to one another, so that electrical contact between respective ones of the first pins and the second pins is facilitated. This combination may further comprise at least one additional semiconductor member, the additional semiconductor member having additional pins, the additional pins having portions extending along a side of the additional semiconductor member, the additional pins being disposed on the additional semiconductor member so as to align with additional pins on an additional side of the first semiconductor member or the second semiconductor member when the additional semiconductor member is placed in close proximity to the first semiconductor member or the second semiconductor, so that electrical contact between respective ones of the additional pins and the first pins or second pins is facilitated. The semiconductor members are disposed so as to be coplanar.

The invention is further directed to a semiconductor die substrate comprising a planar semiconductor member, the member having a plurality of micro-cups formed on a surface thereof, at least a portion of the micro-cups being sized, shaped and positioned so as to receive micro-pins. The semiconductor die may be combined with a second semiconductor die. The second semiconductor die may comprise a planar semiconductor member; a plurality of conductive micro-pins extending from the semiconductor member in a direction parallel to a plane of the semiconductor member, with the micro-pins being received in the micro-cups. Preferably, the semiconductor die substrate and the second semiconductor die are perpendicular to one another. The combination may further comprise at least one bracket member, the bracket member having a first surface in contact with the semiconductor die substrate and a second surface in contact with the second semiconductor die.

The combination may also further comprise an adhesive material disposed between the semiconductor members to facilitate the semiconductor members being secured to one another.

The invention is also directed to a method for forming a semiconductor die, comprising forming a trench in a surface of the die; filing the trench with a sacrificial material; patterning the die to form a series of channels extending substantially perpendicularly to the trench; depositing a conductive material in the channels; removing at least a portion of the sacrificial material; and removing portions of the die under the trench so as to separate a portion of the die on one side of the trench from a portion on another side of the trench. The method may further comprise patterning the sacrificial material so that the channels extend so as to be partially in a portion of the die and partially a portion of the sacrificial material. The sacrificial material may be patterned to a depth greater than the die. The removing may be performed by grinding or etching of the die.

The die may be part of a wafer having a plurality of dies, and the trench may be a dicing lane of the wafer. The sacrificial material may be a polymer or a photoresist. The conductive material may be one of a metal, a conductive paste, and a solder.

The method may further comprise depositing an adhesion layer in the channels prior to depositing the conductive material. The adhesion layer may be formed of a polymer or a silicon oxide.

The invention is further directed to a method for forming a semiconductor die, comprising forming a trench in a surface of the die; filing the trench with a sacrificial material; patterning the die to form a series of channels extending substantially perpendicularly to the trench; depositing a conductive material in the channels; removing portions of the die under the trench; and removing at least a portion of the sacrificial material so as to separate a portion of the die on one side of the trench from a portion on another side of the trench.

In accordance with one additional aspect, the invention is also directed to a method of forming substrates with at least one micro-cup, comprising forming at least one via in the substrate; coating the at least one via with a conductive material or a conductive and adhesive material to form the micro-cup; and coating adhesive material on the substrate to facilitate attachment of a device having at least one pin, the at least one pin being sized, shaped and positioned to be received in a respective one of the at least one via. The method may further comprise assembling the device to the substrate.

BRIEF DESCRIPTION OF THE DRAWINGS

These and other aspects, features, and advantages of the present invention will become apparent upon further consideration of the following detailed description of the invention when read in conjunction with the drawing figures, in which:

FIGS. 3A–3F are side views of an alternate embodiment showing stacking of semiconductor chips using micro-pins in accordance with the present invention.

FIG. 10A–10D are sectional views showing process steps to fabricate micro-cups on a substrate.

FIG. 12 is a plan view of horizontal tiling of semiconductor dies in accordance with yet another aspect of the invention.

DESCRIPTION OF THE INVENTION

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

Figure 1:
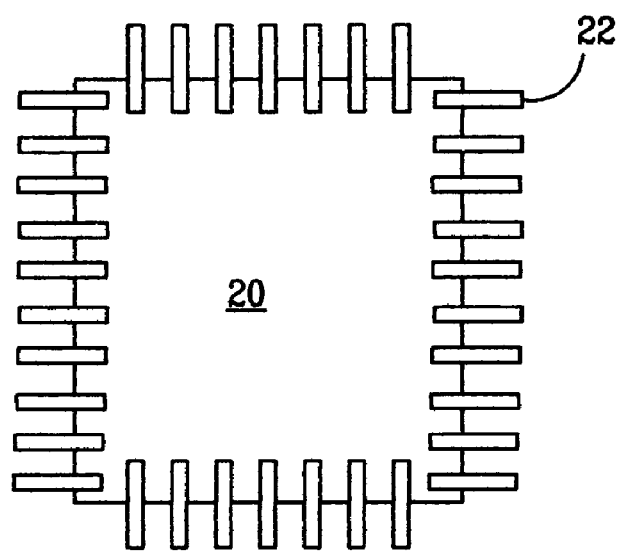
FIG. 1 is a plan view of an embodiment of a semiconductor die with micro-pins of the present invention.

Referring to the drawings more particularly by reference numbers, FIG. 1 shows an embodiment of a semiconductor die 20 with micro-pins 22 of the present invention. The semiconductor die may include plurality of micro-pins on any one or all sides of the die. These micro-pins are electrically connected to devices on the die 20. Typical dimensions for the micro-pins 22 may be a length of 1 to 1000 microns, a width of 1 to 500 microns and a depth of 1 to 800 microns in the direction into the die 20, although these dimensions are provided merely by way of example. Actual dimensions will depend on the requirements of the specific application.

Figure 2A:
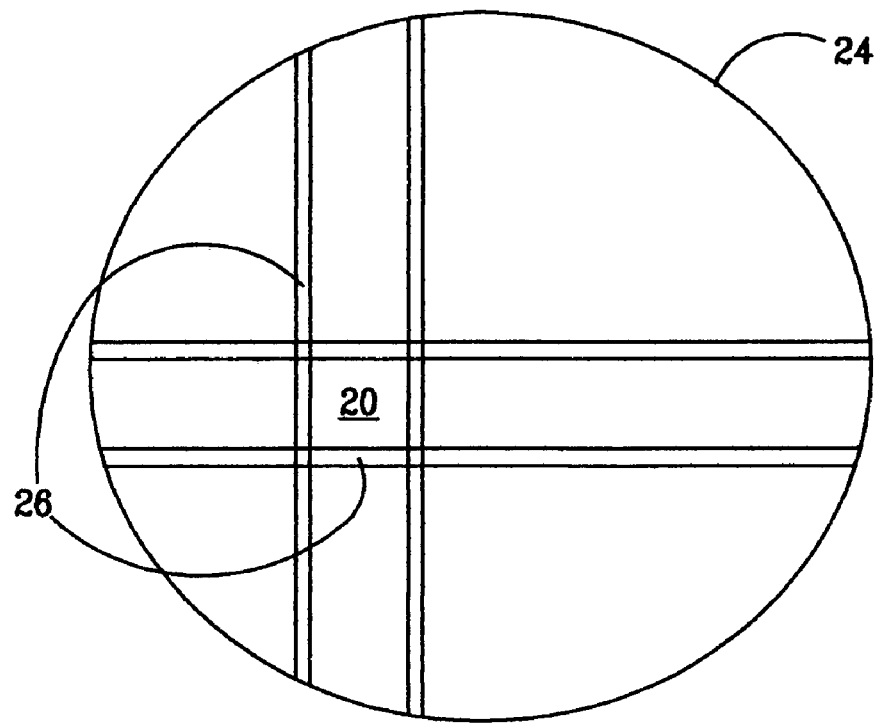
FIGS. 2A–2Q are cross sectional side views showing process steps to fabricate a semiconductor die with micro-pins as well as the forming of electrical connection between micro-pins and devices on the semiconductor die, while FIG. 2B(i) is a plan view of a portion of FIG. 2A.
Figure 2B:
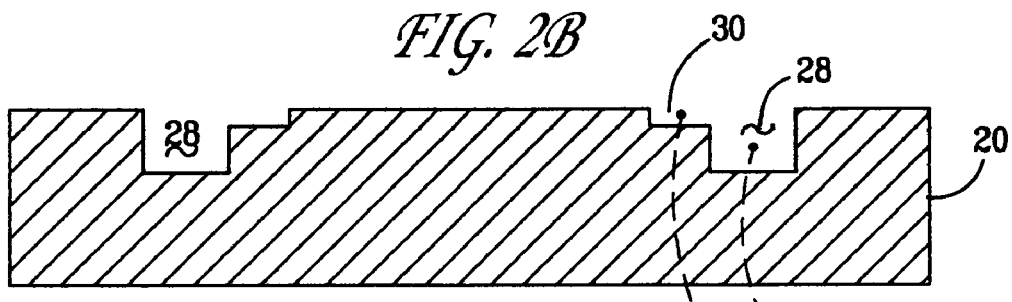
Figure 2B:
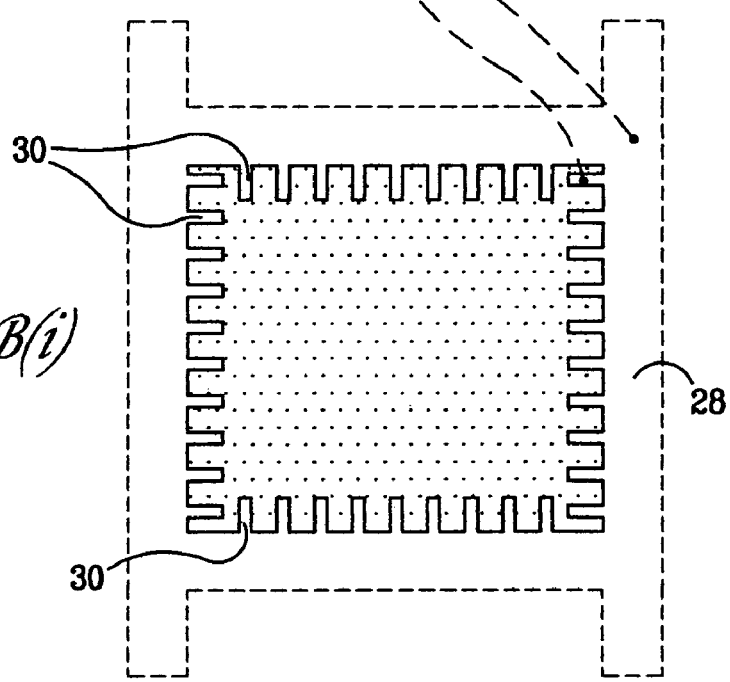

FIG. 2A and FIG. 2B show first steps in the process of fabricating semiconductor die with micro-pins 22. A portion 24 of a typical semiconductor wafer having chips 20 separated by dicing lanes or kerfs 26, extending in two mutually perpendicular directions so as to from rectangular dies, is shown in FIG. 2A. The widths of these dicing lanes or kerfs 26 is application dependent.

Figure 2C:
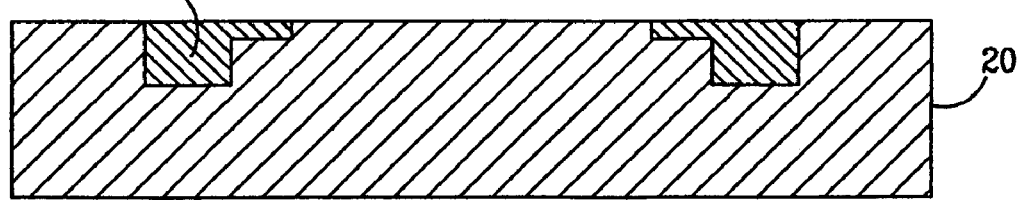

As shown in FIG. 2B and FIG. 2B(i), trenches 28 may be created on the wafer with known wet or dry etching processes. The trenches 28, having dimensions which may vary with the application, may be placed at least partially in the dicing lanes or kerfs 26, and have extensions 30 which are used to form the micro-pins 22. The trenches 28 and their extensions 30 may be filled with a sacrificial epoxy, polymer, photoresist or similar material 31 as shown in FIG. 2C.

Using known photolithographic process, the polymer or polymer like material may be patterned and etched using wet or dry etching processes as shown in FIG. 2D(i) and 2D(ii). The wet or dry etching processes may be selective with respect to semiconductor material and may allow the formation of a specific structure, such as, for example, the channel 32 of FIG. 2D(i) or the step structure 34 as shown in FIG. 2D(ii).

The patterned and etched features may be filled with conductive material such as copper, metallic paste, solder, etc. to form micro-pins 22 as shown in FIG. 2E(i), for the case of the pattern formed in FIG. 2D(i), and the micro-pins 22A of FIG. 2E(ii), for the case of the pattern formed in FIG. 2D(ii). Prior to filling the patterned features with conductive material, layers of passivation films such as silicon oxide or silicon nitride, adhesive films such as polymeric or epoxy materials or metals such as indium, tin, and plating seed or barrier layers such as titanium, tantalum, chromium or copper may be deposited in the patterned features.

As an optional step, additional conductive materials 36 such as metals or conductive polymers may be patterned, coated or deposited on top of micro-pins as shown in FIG. 2F(i) and FIG. 2F(ii). The polymer like material 31 deposited in the trenches as described above with respect to FIG. 2C may be removed partially or completely from the trenches as shown in FIG. 2G(i) and FIG. 2G(ii).

Using a laser saw or dicing saw or any other known method, the semiconductor wafer may be diced from the back side as shown in FIG. 2H(i) and FIG. 2H(ii). Waste portions 40 are discarded. As part of the dicing/singulating process, the wafer may temporarily be attached to a dicing tape or substrate (not shown). The process sequence described in FIG. 2a–2h results into individual semiconductor dies with micro-pins 22 or 22A. Micro-pins 22 are essentially embedded in the surface of die 20. Micro-pins 22 then extend in a cantilevered fashion horizontally away from die 20. Micro-pins 22A also may be embedded in the surface of die 20. However, micro-pins 22A have a portion 23 extending downward and against the vertical side surface of die 20.

An alternate process of fabricating semiconductor die with micro-pins is described in FIGS. 2I–2K. Preferably, immediately following process step described in FIG. 2F(i) or FIG. 2F(ii), the wafer may be ground from the backside as shown in FIG. 2I(i) and FIG. 2I(ii). During the backside grind step, the front side of the semiconductor wafer temporarily may be attached to an adhesive tape or a substrate (not shown). The backside grind step may include a coarse grind, a fine grind and a chemical mechanical polishing (CMP) steps. The backside grinding of the semiconductor wafer may stop when the polymer like film or conductive material is exposed as shown in FIG. 2I(i) and FIG. 2I(ii).

The semiconductor material on the backside of the wafer may be removed or etched using wet or dry processes as shown in FIG. 2J(i) or FIG. 2J(ii). The polymer like material deposited in the trenches as described above with respect to FIG. 2C may be removed as shown in FIG. 2K(i) and FIG. 2K(ii). The process sequence described in FIG. 2I–2K results in individual semiconductor dies with micro-pins 22B or 22C, which extend below the back side of the respective dies 20. Referring to FIG. 2K(i) specifically, micro-pins 22B are formed with a lower portion 25 that extends below die 20. Referring to FIG. 2K(ii) specifically, micro-pins 22C extend downward and against the vertical side surface of die 20 and below die 20. Micro-pins 22B and 22C are especially advantageous in allowing dies having micro-pins with these configuration to be stacked, as described in more detail below.

The semiconductor dies with micro-pins produced using the process of FIG. 2I to FIG. 2k can be very thin (1 to 400 micrometers thick) and the requirement of dicing the wafer to obtain individual dies is avoided. Although not specifically mentioned above, the step involving removal of polymer like material, as described with respect to FIG. 2K, may be exercised prior to the step of grinding the wafer from the back as described with respect to FIG. 2I.

Figure 2M:
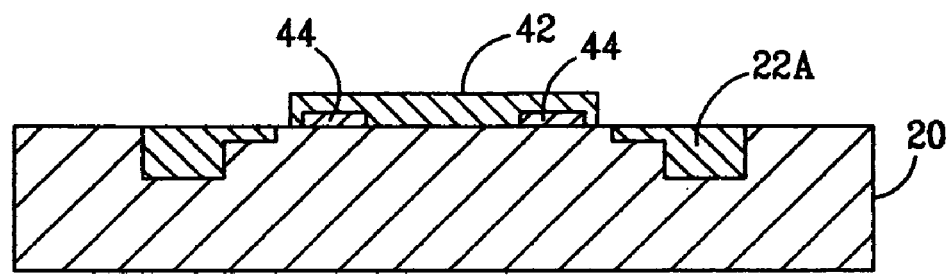
Figure 2N:
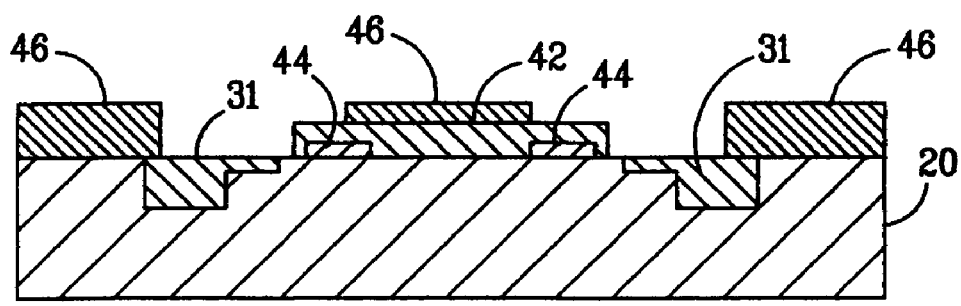
Figure 2O:
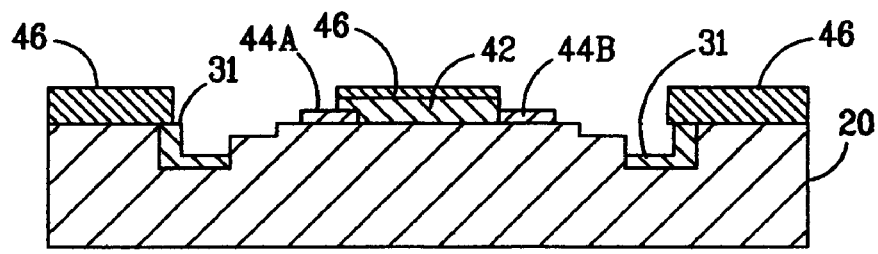
Figure 2P:
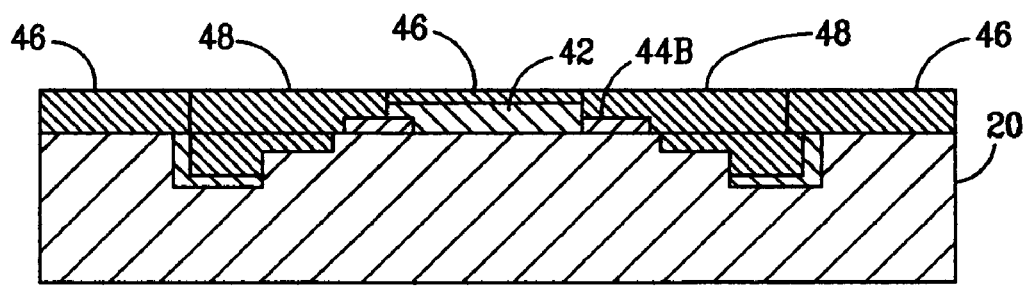
Figure 2Q:
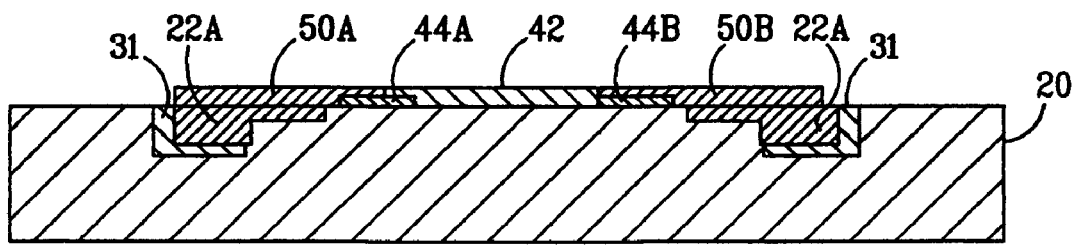

FIG. 2L FIG. 2Q illustrate steps in forming an electrical connection between the micro-pins and devices on the semiconductor die. A sectional view of a semiconductor die on a semiconductor wafer at the end of final passivation step, having a final passivation layer 42 is shown in FIG. 2L. At this point, die terminal pads 44 are covered with the final passivation layer 42. Micro-pin fabrication process steps described in FIG. 2B to FIG. 2C may be applied to the semiconductor wafer 20 as shown in FIG. 2M, to produce, for example, micro-pins 22A.

Using known photolithographic process, a photo-polymeric material 31 may be patterned onto the wafer in FIG. 2N. As part of process step illustrated in FIG. 2D, the photo-polymer material 31 may be patterned such that it uncovers the trench and die terminal pads 44 which are covered in FIG. 2N. The polymer like material 31 in the trench and the passivation material 42 on top of die terminal pads 44 may be partially etched (partially uncovering a terminal pad 44A) or completely etched (completely uncovering a terminal pad 44B) using wet or dry processes as shown in FIG. 2O, in the manner described with respect to FIG. 2D(i) and FIG. 2D(ii).

Referring to FIG. 2P, the patterned and etched features may be filled with conductive material 48 such as copper, metallic paste, solder, etc to form micro-pins 22C. Prior to filling the patterned features with conductive material, layers of passivation films such as silicon oxide or silicon nitride, adhesive films such as polymeric or epoxy materials or metals such as indium, tin, and plating seed or barrier layers such as titanium, tantalum, chromium and copper may be deposited in the patterned features.

Referring to FIG. 2Q, the photo-polymer material 46 may be removed from the wafer surface to produce the structure shown therein. The process steps described with respect to FIG. 2L to FIG. 2Q may be performed. Electrical connections 50A and 50B may then be made to the micro-pins 22A and to devices (not shown) on the die 20 by means of die terminal pads 44A and 44B. The wafer may be subjected to process steps described with respect to FIG. 2F to FIG. 2h or FIG. 2I to FIG. 2K to obtain a semiconductor die with micro-pins.

FIG. 3A to FIG. 3F are side views of various embodiments showing stacking of semiconductor chips using micro-pins and/or joining material formed on top of micro-pins. In FIG. 3A the dies 20 have micro-pins 22B. In FIG. 3B the dies 20 have micro-pins 22A, which extend below the lower surface or back side of dies 20. The application of suitable heat and pressure may result in diffusion bonding of the micro-pins. The embodiment of FIG. 3C is similar to that of FIG. 3A, but a joining material 54 is used between the micro-pins 22B of successive dies 20. In FIG. 3D, a joining material 54 is used between the micro-pins 22C of successive dies 20. In FIG. 3E, a chip formed on a relatively smaller die 20A of is stacked on top of a chip formed on a relatively larger die 20B. A joining material 54 is used between the bottom surface of micro-pins 22B and the top surface of die 20B. In FIG. 3F, the lower surfaces of micro-pins 22C of a die 20A may be placed on the upper surface of a die 20B, with or without the use of a joining layer. If no joining layer is used, diffusion bonding may be utilised. These embodiments may be employed when stacking of thin semiconductor chips of same or different sizes on top of each other is desired to gain electrical performance or to achieve a compact, dense system that fully utilises three-dimensional integration.

Figure 4A:
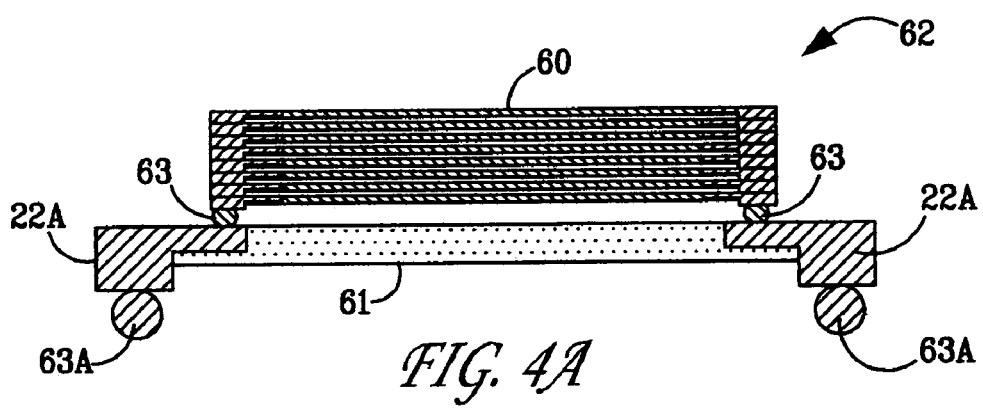
FIGS. 4A–4C are side views of an alternate embodiment showing attachment of semiconductor die stack on another semiconductor die, interposer, or a substrate.
Figure 4B:
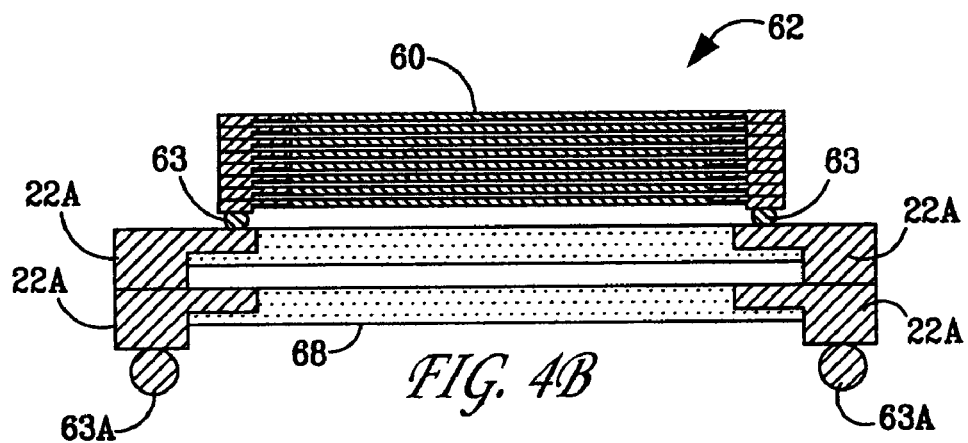
Figure 4C:
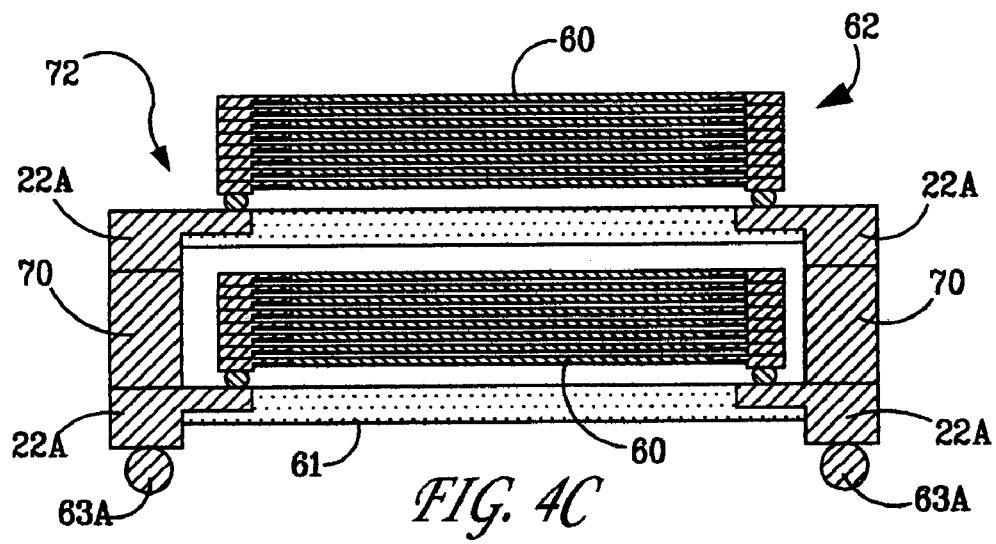

FIG. 4A to FIG. 4C are side elevational views of alternate embodiments showing attachment of a semiconductor dies stack 60 on another semiconductor die, on an interposer, or on a substrate. As shown in FIG. 4A, the semiconductor die stack 60, comprising memory chips, for example, may be attached to a semiconductor die, a substrate or an interposer 61 to construct a complex, high performance multi-chip module shown generally as 62. Substrate 61 may itself have micro-pins of the type 22A to which stack 60 is attached. Attachment may be effected using attachment members 63 such as a solder ball, conductive adhesive, or a metal, as is well known in the art. Attachment members 63A may be used to affix and electrically connect multi-chip module 62 to the next level of packaging.

FIG. 4B is a side elevational view of stacking of the chip module 62 of FIG. 4A onto another semiconductor interposer 68. Similarly, as shown in FIG. 4C, chip modules 62 of kind illustrated in FIG. 4A may be stacked on top of each other, by interposing a spacer 70 to achieve an extremely dense high performance system, shown generally as 72.

Figure 5A:
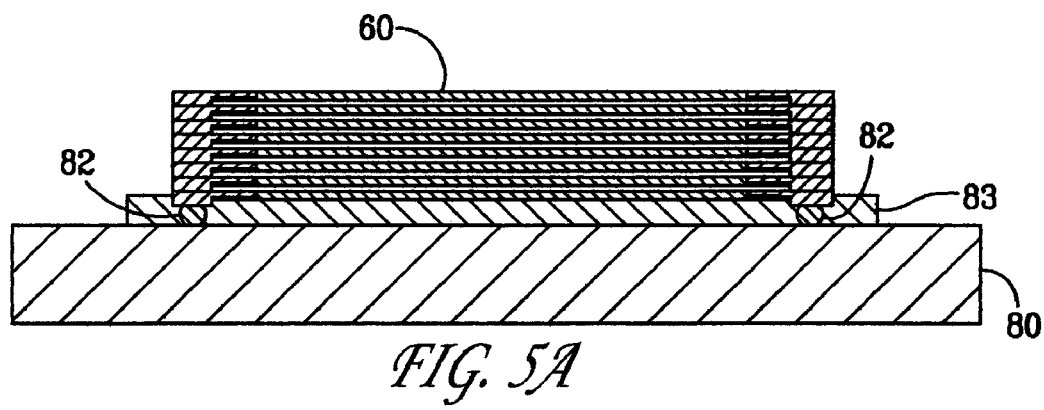
FIGS. 5A–5B are side views of an alternate embodiment of the invention showing attachment of semiconductor die stack on a substrate.
Figure 5B:
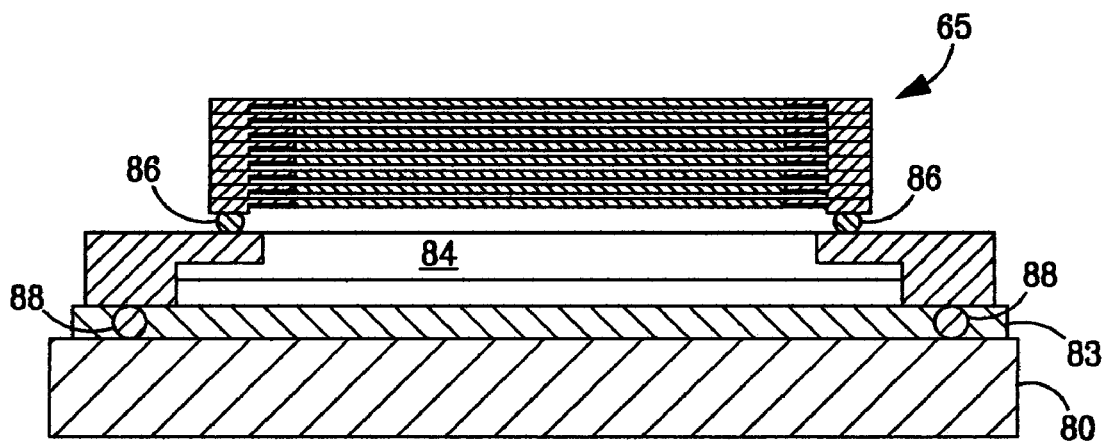

FIG. 5A and FIG. 5B are side elevational views of alternate embodiments showing attachment of a semiconductor die stack 60 to a non-semiconductor substrate 80 of a next level of packaging such as a ceramic substrate, FR-4 board or a high density substrate. In FIG. 5A, the stack 60 of dies is connected directly to the non-semiconductor substrate 80 by means of a metal, solder or conductive adhesive, which may be in the form of attachment members 82. An underfill material 83, such as an epoxy or polymer resin may then be applied. In FIG. 5B, a chip module shown generally as 65 is connected directly to a substrate 84 by means of a metal, solder conductive adhesive, which may be in the form of attachment members 86. Substrate 84 is then connected to a substrate 80 by means of a metal, solder, or conductive adhesive, which may be in the form of attachment members 88. An underfill 83 may also be applied. These embodiments may be used in creating a high performance computer where the substrates shown in FIG. 5A or FIG. 5B are then connected in parallel, through a backplane (not shown), to a cabinet panel (also not shown).

Figure 6A:
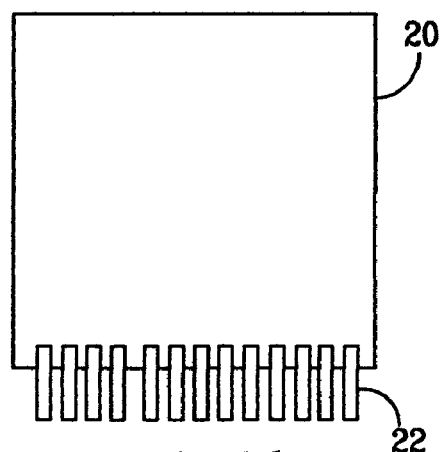
FIGS. 6A–6B are frontal and edge view of a semiconductor die with micro-pins.
Figure 6B:
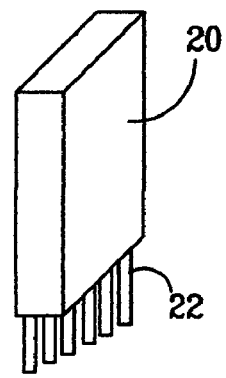

FIG. 6A and FIG. 6B are plan and perspective views, respectively, of a semiconductor die 20 with micro-pins 22 on one of its sides.

Figure 7A:
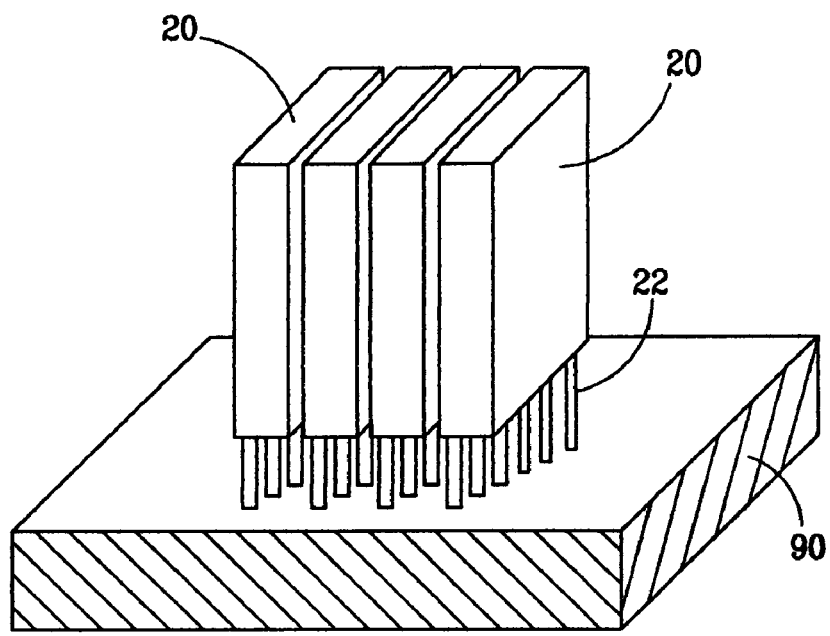
FIG. 7A–7B are side views of an alternate embodiment showing semiconductor chips with micro-pins assembled vertically adjacent to each other on a substrate.
Figure 7B:
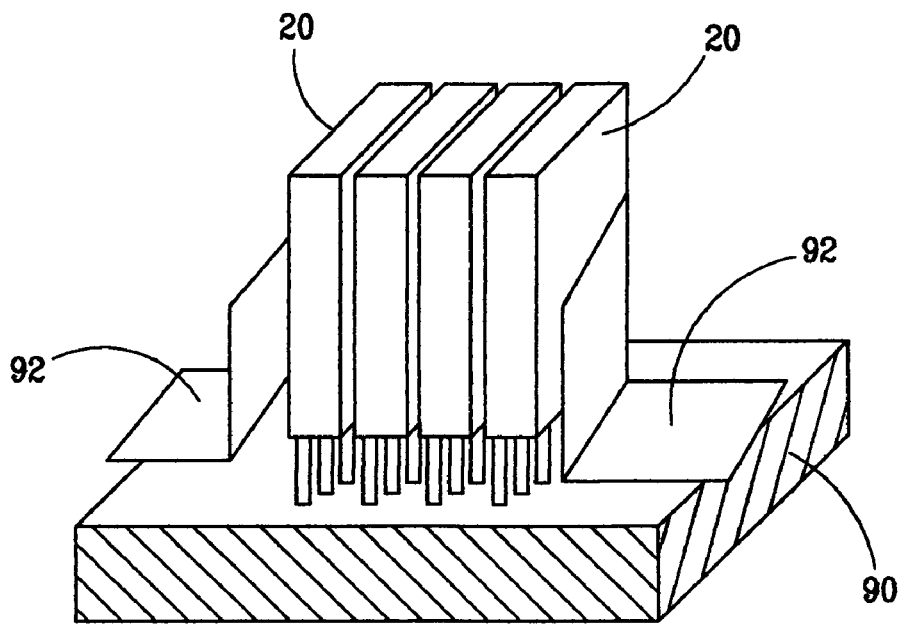

FIG. 7A and FIG. 7B are perspective views of an alternate embodiment showing semiconductor chips or dies 20 with micro-pins 22 assembled vertically adjacent to each other on a substrate 90. The semiconductor dies, each with micro-pins on one of its sides, may be attached to a substrate vertically adjacent to each other as shown in FIG. 7A. This embodiment is useful when it is desired to achieve a high packing density or to provide a highly compact system, by assembling chips adjacent to each other rather, than on top of each other. Assembling chips adjacent to each other is especially attractive when the chips have differing dimensions. In contrast to attaching a die so that it is flat on the substrate, vertical attachment of semiconductor dies using micropins as described by this embodiment also assists in reducing thermo-mechanical stresses arising as a result of difference in the Coefficient of Thermal Expansion (CTE) that typically exists between a semiconductor die and a non-semiconductor substrate such as an FR-4 board or a high density substrate. This is because the distance from die neutral point (DNP) on the substrate is significantly reduced in vertical assembly, as opposed to that in horizontal assembly. Vertically assembled chips as shown in FIG. 7A may be firmly supported by specially designed mechanical clamps or fixtures 92 as shown in FIG. 7B.

Figure 8A:
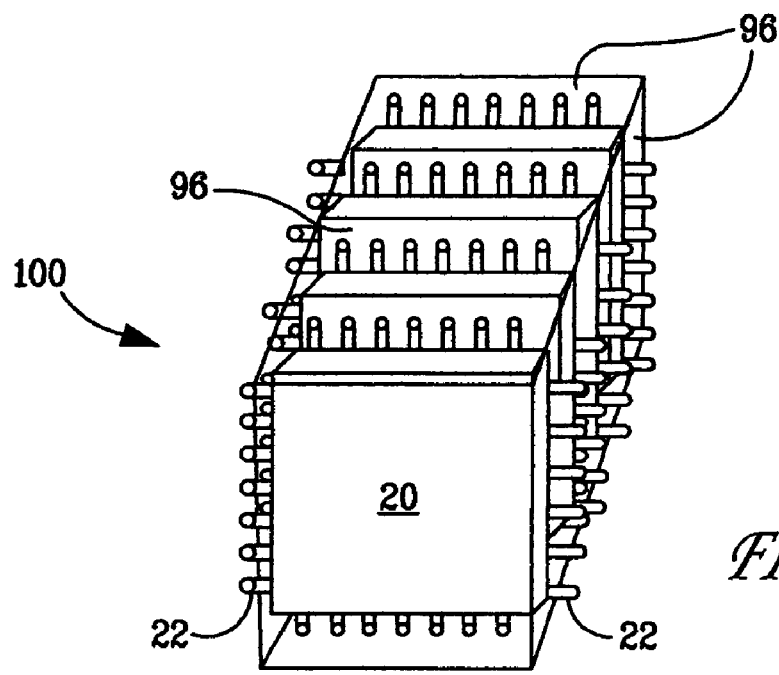
FIG. 8A–8B is an alternate embodiment showing semiconductor chips with micro-pins assembled in a cube surrounding by multiple substrates.
Figure 8B:
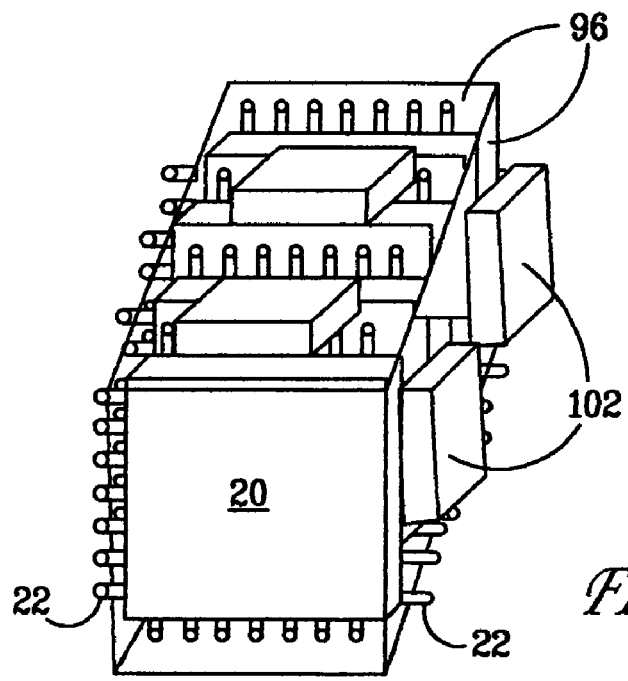

FIG. 8A is an alternate embodiment showing semiconductor chips or dies 20 with micro-pins 22 assembled in a rectangular solid or a cube and attached to wiring backplanes, substrates or interposers 96, and in the form of a cube 100. This is a useful embodiment when an extremely dense system is desired. For example, memory chips can be assembled in a cube surrounding by wiring planes and respective processor or logic chips 102 can be assembled on the wiring substrate as shown in FIG. 8B. As such, processor or logic chips can readily access memory that is assembled in the cube. The semiconductor chips or dies 29 with micro-pins 22 can be assembled to form a rectangular solid or more particularly the cube 100 by joining the chips to the wiring backplanes, substrates or interposers 96 having dual or single sided wiring and a surface metallurgy that is able to bond by means of metal, solder or electrically conductive adhesive. In this case, the wiring backplanes or substrates will form the faces of the cube 100 with singular or multiple chips inside such cube. Once such system is constructed, the additional chips 102 can be readily attached to the outer side of the wiring backplanes or substrates forming the cube by similar means of metal, solder or electrically conductive adhesive.

Figure 9:
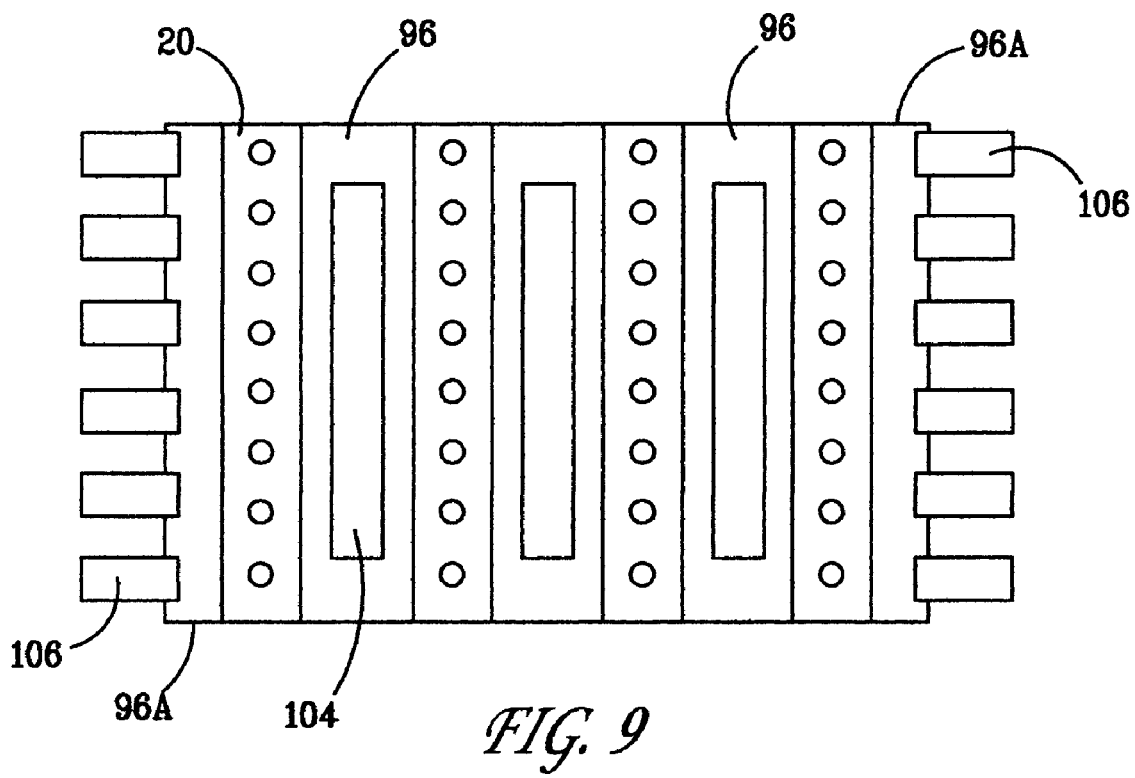
FIG. 9 is a side elevational view of semiconductor chip cube of FIG. 8A.

FIG. 9 shows a side elevational view of the cube system shown in FIG. 8. The wiring plane or substrates 96 of the cube system may have holes/slots 104 in them to allow for thermal management, as for example, by circulating a cooling fluid through the holes or slots 104. The wiring planes 96A at opposite sides of the cube 100 may additionally have connectors 106 that allow attachment of the system to the next higher level of packaging.

Figure 10A:
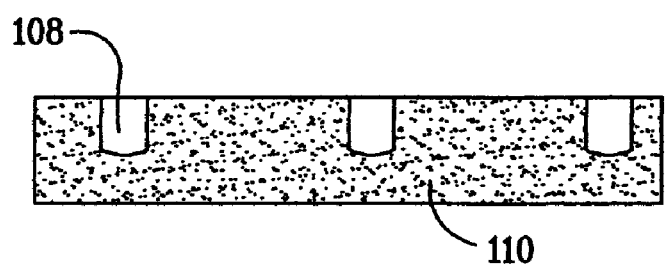
Figure 10D:
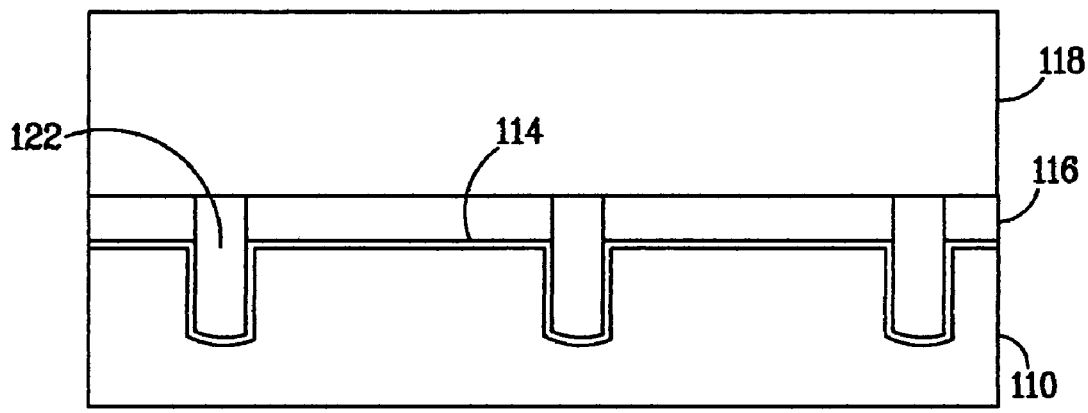

FIG. 10A to FIG. 10D are sectional views showing process steps to fabricate micro-cups on a substrate that may be useful in making electrical and mechanical connection between semiconductor dies with micro-pins and the substrate, as well as to other components on the substrate. Via cups 108 may be formed, by any known wet or dry chemical process, in the substrate 110 as shown in FIG. 10A. The substrate may be a semiconductor die, package interposer, or of other forms as used in the electronics industry. Vias for this purpose may also vary in size and shape. The vias may be filled or coated with adhesive and/or conductive material 112 as shown in FIG. 10B. Such adhesive or conductive material may help in achieving an electrical and mechanical connection between the device with micro-pins and the substrate. Micro-pins may be connected to other points on the substrate by use of electrical connections that are made to micro-cups, by for example, a thin electrically conductive layer 114, deposited on the surface of substrate 110, which extends into cups 108, as shown in FIG. 10C(i) and FIG. 10C(ii). Additionally, a layer of adhesive material 116 may be coated on the substrate to act as "glue" between the semiconductor die with micro-pins and the substrate 110. Layer 116 may be one of a polymer, an epoxy, or a silicon dioxide layer which forms a bond under suitable temperature and pressure conditions. A device 118 having micro-pins 122 is assembled to a substrate 110, as shown in FIG. 10D.

Figure 11A:
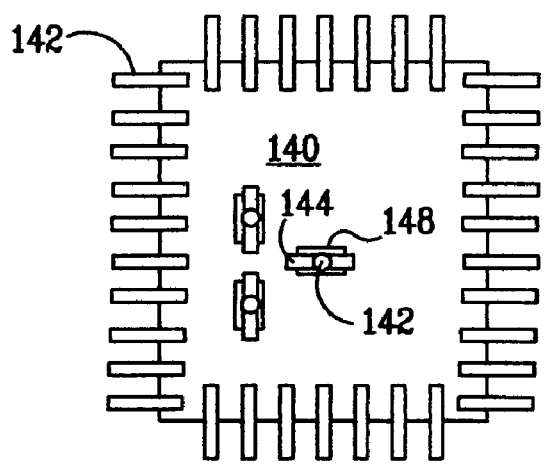
FIG. 11A is a plan view and FIG. 11B is a cross sectional view which illustrate an alternate embodiment showing vertical or horizontal attachment of devices, such as Group III-V devices, on a silicon chip using micro-pins and micro-cups.
Figure 11B:
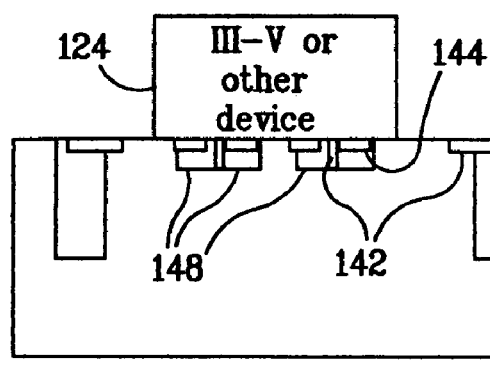

FIG. 11A and FIG. 11B illustrate an alternate embodiment showing vertical or horizontal attachment of devices, such as a Group III-V (compound semiconductor, such as GaAs, InP) device or other device 124, on a silicon chip or die 140. The die 140 has micro-pins 142, while the device 124 has micro-pins 144, which are received in micro-cups 148. This embodiment is useful when it is necessary to build heterogeneous system. The device 124 is attached at a point in the fabrication process later than that at which micro-pins 144 are formed.

FIG. 12 illustrates an embodiment of the invention wherein dies 20 having micro-pins 22 are arranged in a horizontal plane so that the ends of micro-pins of one die are in physical contact with the ends of micro-pins 22 of an adjacent die. Although the ends are shown as being in contact, in principle, the dies may be positioned so that the sides of the micro-pins 22 of one die contact the sides of the micro-pins 22 of an adjacent die. In either case, electrical connection between the micro-pins 22 may be made with a solder, a conductive adhesive, or by diffusion bonding of the micro-pins of one die to the micro-pins of an adjacent die under suitable temperature and pressure conditions. This "tiling" arrangement is especially advantageous in that it provides an extremely high bandwidth connection between the dies.

The present invention advantageously has advantages and other uses not specifically discussed above. For example, micro-pins and micro-cups may provide attachment or connection points for the testing of chips. In such case, micro-pins can temporarily be used to test the chips when fabricated, as well as attachment of chips to next level of packaging, after testing.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

I claim:

1. A method for forming a semiconductor die, comprising:
    forming a trench in a surface of said die;
    filing the trench with a sacrificial material;
    patterning said die to form a series of channels extending substantially perpendicularly to said trench;
    depositing a conductive material in said channels;
    removing at least a portion of the sacrificial material; and
    removing portions of said die under said trench so as to separate a portion of said die on one side of said trench from a portion on another side of said trench;
    wherein said conductive material forms a plurality of conductive pins extending from said semiconductor die in a direction parallel to a plane of said semiconductor die.

2. The method of claim 1, further comprising:
    patterning said sacrificial material so that said channels extend so as to be partially in a portion of said die and partially a portion of said sacrificial material.

3. The method of claim 1, wherein said sacrificial material is patterned to a depth greater than said die.

4. The method of claim 1, wherein said removing is performed by grinding or etching of said die.

5. The method of claim 1, wherein said die is part of a wafer having a plurality of dies, and said trench is a dicing lane of said wafer.

6. The method of claim 1, wherein said sacrificial material is a polymer.

7. The method of claim 1, wherein said sacrificial material is a photoresist.

8. The method of claim 1, wherein said conductive material is one of a metal, a conductive paste, and a solder.

9. The method of claim 1, further comprising depositing an adhesion layer in said channels prior to depositing said conductive material.

10. The method of claim 9, wherein said adhesion layer is formed of a polymer and a silicon oxide.

11. The method of claim 1, further comprising:

forming a plurality of vias in a substrate;

coating said plurality of vias with a conductive material or a conductive and adhesive material to form a plurality of micro-cups; and coating adhesive material on the substrate to facilitate attachment of said die said plurality of pins being sized, shaped and positioned to be received in a respective one of said at least one via.

12. The method of claim 11, further comprising assembling said device to said substrate.

13. The method of claim 1, wherein said semiconductor die has a plurality of sides, and wherein said pins extend from at least one of said sides.

14. The method of claim 1, wherein said pins are micropins having a of length of 1 to 1000 microns, a width of 1 to 500 microns and a depth of 1 to 800 microns in the direction into the die.

15. The method of claim 1, wherein said semiconductor die has a plurality of sides, and wherein said pins extend along said sides in a direction perpendicular to a plane of said semiconductor die.

16. The method of claim 1, further comprising:

assembling said die to a substrate in which a series of openings has been formed, said openings being sized and spaced so as to receive said pins, so that said pins are received in said openings; and securing said die to said substrate.

17. The method of claim 16, wherein said securing of said die is performed by providing an adhesive between contacting surfaces of said die and said substrate.

18. The method of claim 1, further comprising:

providing an additional die with said pins: and assembling said pins of said respective dies to one another so that at least some pins of said dies are in electrical contact with a pin of the other of said dies.

19. A method for forming a semiconductor die, comprising:

forming a trench in a surface of said die;

filing the trench with a sacrificial material;

patterning said die to form a series of channels extending substantially perpendicularly to said trench;

depositing a conductive material in said channels;

removing portions of said die under said trench; and removing at least a portion of the sacrificial material so as to separate a portion of said die on one side of said trench from a portion on another side of said trench;

wherein said conductive material forms a plurality of conductive pins extending from said semiconductor die in a direction parallel to a plane of said semiconductor die.

20. A method for forming a semiconductor die, comprising:

forming a trench in a surface of said die;

filing the trench with a sacrificial material;

patterning said die to form a series of channels extending substantially perpendicularly to said trench;

depositing a conductive material in said channels;

removing at least a portion of the sacrificial material; and removing portions of said die under said trench so as to separate a portion of said die on one side of said trench from a portion on another side of said trench;

wherein said sacrificial material is patterned to a depth greater than said die.

21. A method for forming a semiconductor die, comprising:

forming a trench in a surface of said die;

filing the trench with a sacrificial material;

patterning said die to form a series of channels extending substantially perpendicularly to said trench;

depositing a conductive material in said channels;

removing at least a portion of the sacrificial material;

removing portions of said die under said trench so as to separate a portion of said die on one side of said trench from a portion on another side of said trench; and depositing an adhesion layer in said channels prior to depositing said conductive material, wherein said adhesion layer is formed of a polymer and a silicon oxide.

* * * * *